United States Patent
Lin

(10) Patent No.: US 11,171,263 B2
(45) Date of Patent: Nov. 9, 2021

(54) QUANTUM DOT AND MANUFACTURING METHOD FOR THE SAME AND APPLICATION USING THE SAME

(71) Applicant: Chi Mei Corporation, Tainan (TW)

(72) Inventor: Keng-Chu Lin, Tainan (TW)

(73) Assignee: CHIMEI CORPORATION, Tainan (TW)

(*) Notice: Subject to any disclaimer, the term of this patent is extended or adjusted under 35 U.S.C. 154(b) by 120 days.

(21) Appl. No.: 16/680,616

(22) Filed: Nov. 12, 2019

(65) Prior Publication Data
US 2020/0203578 A1 Jun. 25, 2020

(30) Foreign Application Priority Data
Dec. 21, 2018 (TW) ................. 107146544

(51) Int. Cl.
*H01L 33/50* (2010.01)
*C09K 11/02* (2006.01)

(52) U.S. Cl.
CPC .......... *H01L 33/502* (2013.01); *C09K 11/025* (2013.01); *H01L 33/507* (2013.01)

(58) Field of Classification Search
CPC ......... B82Y 20/00; B82Y 30/00; B82Y 40/00; C09K 11/025; C09K 11/883; H01L 33/502; H01L 33/507; H01L 33/56
See application file for complete search history.

(56) References Cited

U.S. PATENT DOCUMENTS

| | | | |
|---|---|---|---|
| 8,237,154 B2 | 8/2012 | Jang et al. | |
| 10,030,851 B2 | 7/2018 | Koole et al. | |
| 2006/0029802 A1 | 2/2006 | Ying et al. | |
| 2006/0082296 A1 | 4/2006 | Chua et al. | |

(Continued)

FOREIGN PATENT DOCUMENTS

| | | |
|---|---|---|
| CN | 102690658 A | 9/2012 |
| CN | 108102640 A | 6/2018 |

(Continued)

OTHER PUBLICATIONS

TIPO Office Action dated Jul. 26, 2019 in corresponding Taiwan application (No. 107146545).

(Continued)

*Primary Examiner* — Allan R Wilson
(74) *Attorney, Agent, or Firm* — McClure, Qualey & Rodack, LLP

(57) ABSTRACT

The present disclosure provides a quantum dot and a manufacturing method for the same, and a luminescent material, a light-emitting element and a display device applying the quantum dot. The quantum dot includes a nano-crystal and a ligand. The nano-crystal is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. The ligand is disposed on a surface of the nano-crystal. The ligand contains 15%-70% of a fatty acid compound, 1%-35% of a phosphine compound, >0%-55% of a thiol compound, and 0%-10% of another ligand substance.

18 Claims, 3 Drawing Sheets

(56) References Cited

U.S. PATENT DOCUMENTS

| | | | |
|---|---|---|---|
| 2007/0132052 A1* | 6/2007 | Sargent | H01L 51/4253 257/443 |
| 2007/0199109 A1 | 8/2007 | Yi et al. | |
| 2008/0012001 A1 | 1/2008 | Gillies | |
| 2010/0051898 A1 | 3/2010 | Kim | |
| 2010/0224831 A1 | 9/2010 | Woo et al. | |
| 2011/0101387 A1* | 5/2011 | Kinomoto | C09K 11/62 257/89 |
| 2011/0156575 A1 | 6/2011 | Yu et al. | |
| 2011/0214488 A1 | 9/2011 | Rose et al. | |
| 2014/0101980 A1 | 4/2014 | Best et al. | |
| 2015/0253474 A1 | 9/2015 | Guo | |
| 2016/0027971 A1 | 1/2016 | Anc | |
| 2016/0084476 A1 | 3/2016 | Koole et al. | |
| 2017/0267924 A1 | 9/2017 | Kuwabata | |
| 2018/0148638 A1 | 5/2018 | Ahn et al. | |
| 2019/0044025 A1 | 2/2019 | Chen | |

FOREIGN PATENT DOCUMENTS

| | | |
|---|---|---|
| JP | 2010209314 A | 9/2010 |
| JP | 2016516853 A | 6/2016 |
| KR | 20080017553 A | 2/2008 |
| KR | 20150121722 A | 10/2015 |
| KR | 20150133790 A | 11/2015 |
| KR | 20170011616 A | 2/2017 |
| TW | I636120 B | 9/2018 |

OTHER PUBLICATIONS

Non-Final Office Action issued in U.S. Appl. No. 16/197,470, filed Nov. 21, 2019, dated Sep. 20, 2019.

Xie et al. "Synlhwsis and Photoluminescence Properties of-sialon: Eu2+ Si6-zAlzOzN8-z:Eu2+. . . ", Journal of The Electrochemical Society, 154(10)J314-J319(Year: 2007).

JP Office Action (and English translation) dated Jun. 2, 2020 in JP application (No. 2018227046).

KPO Office Action (and English translation) dated Jul. 1, 2020 in KR application (No. 10-2018-0154789).

Final Office Action issued in U.S. Appl. No. 16/197,470, filed Nov. 21, 2018, dated Jul. 21, 2020.

Sathe et al., "Mesoporous Silica Beads Embedded with Semiconductor Quantum Dots and Iron Oxide Nanocrystals: Dual-Function Microcarriers for Optical Encoding and Magnetic Separation", Anal. Chem. 2006, 78, 5627-5632 (Year:2006).

Ma et al."Highly bright water-soluble silica coated quantum dots with excellent stability", J. Mater. Chem. B, 2014,2, 5043(Year:2014).

Non-Final Office Action issued in U.S. Appl. No. 16/197,470, filed Nov. 21, 2018, dated Feb. 26, 2020.

TIPO Office Action dated Feb. 7, 2020 in corresponding Taiwan application (No. 107146544).

* cited by examiner

QUANTUM DOT AND MANUFACTURING METHOD FOR THE SAME AND APPLICATION USING THE SAME

This application claims the benefit of Taiwan application Serial No. 107146544, filed Dec. 21, 2018, the subject matter of which is incorporated herein by reference.

BACKGROUND

Technical Field

The disclosure relates in general to a quantum dot and a manufacturing method for the same and an application using the same.

Description of the Related Art

A quantum dot is a semiconductor light-emitting material having a band gap that may be changed with its grain size. As a result, an emission wavelength of the quantum dot may be adjusted by changing a size of the quantum dot. The quantum dot has high color purity and high color saturation, and therefore has gradually been applied in the art of display panels in recent years. A quantum yield is one of the important characteristics of the quantum dot, and represents an efficiency of a conversion from absorbed light into fluorescent light done by the quantum dot. Therefore, a topic regarding methods of increasing the quantum yield of the quantum dot becomes important in the art.

SUMMARY

The present disclosure provides a quantum dot and a manufacturing method for the same, and a luminescent material, a light-emitting element and a display device applying the quantum dot.

According to a first concept of the present disclosure, a quantum dot is provided. The quantum dot comprises a nano-crystal and a ligand. The nano-crystal is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. The ligand is disposed on a surface of the nano-crystal. The ligand contains 15%-70% of a fatty acid compound, 1%-35% of a phosphine compound, >0%-55% of a thiol compound, and 0%-10% of another ligand substance.

According to a second concept of the present disclosure, a quantum dot is provided. The quantum dot comprises a nano-crystal and a ligand. The nano-crystal is at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal. The ligand is disposed on a surface of the nano-crystal. The ligand contains >0%-55% of a thiol compound.

According to a third concept of the present disclosure, a method for manufacturing a quantum dot is provided. The method comprises mixing a nano-crystal and a ligand in a liquid phase environment. The nano-crystal is at least one selected from the group consisting of a XII-XV group compound semiconductor nano-crystal, a XII-XVI group compound semiconductor nano-crystal, a XIII-XV group compound semiconductor nano-crystal, and a XIII-XVI group compound semiconductor nano-crystal. The ligand contains a fatty acid compound, a phosphine compound, and a thiol compound.

According to a fourth concept of the present disclosure, a luminescent material is provided. The luminescent material comprises the aforementioned quantum dot, or the quantum dot manufactured by the aforementioned method.

According to a fifth concept of the present disclosure, a light-emitting element is provided. The light-emitting element comprises a light source and an encapsulating material. The encapsulating material comprises the aforementioned luminescent material according. The encapsulating material encloses the light source.

According to a sixth concept of the present disclosure, a display device is provided. The display device comprises the aforementioned light-emitting element. The display device is at least one selected from the group consisting of a television, a digital photo camera, a digital video camera, a digital photo frame, a mobile phone, a notebook, a mobile computer, a computer screen, a portable game console, a portable information terminal, a portable audio player, a game console, a car display and a wearable device.

The above and other embodiments of the disclosure will become better understood with regard to the following detailed description of the non-limiting embodiment(s). The following description is made with reference to the accompanying drawings.

DETAILED DESCRIPTION

Embodiments of the present disclosure are disclosed in detail as the following accompanying with figures. It is should be noted that elements shown in the figure may be not drawn according to actual scales, and may be drawn with enlarged or reduced sizes optionally for sake of showing features of the present disclosure clearly. The same or similar elements in the specification and the figures may be labeled with the same or similar symbols.

Various features of the present disclosure are disclosed with the following various embodiments or examples, describing the elements and arrangements thereof. It is of course that the embodiments and examples are used for illustrating the present disclosure, and the present disclosure is not limited thereto. In addition, although different embodiments may be illustrated with the same symbols or marks, the repetition symbols or marks are just for sake of simple and clear disclosing the present disclosure, but not indicating specific relations between the illustrated different embodiments and/or structures.

Moreover, it should be understood that there may be additional steps before, during, or after the steps disclosed in the present disclosure. In addition, some steps in an embodiment may be replaced or omitted in another embodiment.

Figure 1:
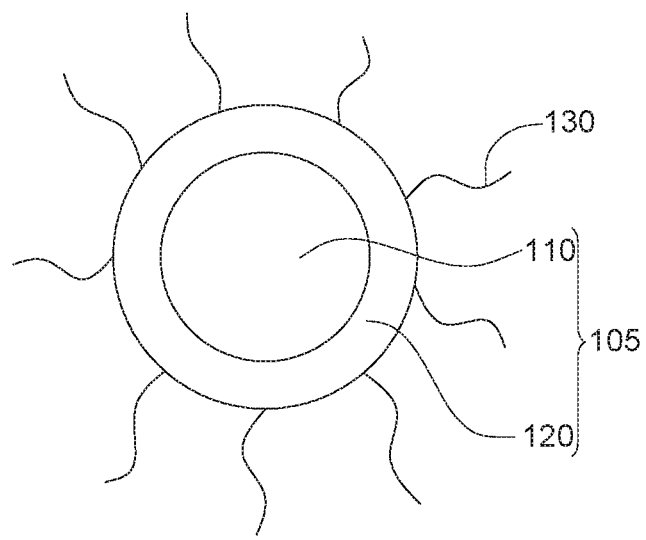
FIG. 1 is a cross-sectional diagrammatic drawing of a quantum dot according to an embodiment of the present disclosure.

FIG. 1 is a cross-sectional diagrammatic drawing of a quantum dot 100 according to an embodiment of the present disclosure.

Referring to FIG. 1, in embodiments, the quantum dot 100 comprises a nano-crystal 105 and a ligand 130. The quantum dot 100 may have a particle size larger than or equal to 10 nm. In embodiments, the nano-crystal 105 is at least one selected from the group consisting of a XII-XV group compound semiconductor nano-crystal, a XII-XVI group compound semiconductor nano-crystal, a XIII-XV group compound semiconductor nano-crystal, and a XIII-XVI group compound semiconductor nano-crystal.

The ligand 130 may be provided onto a surface of the nano-crystal 105 so as to generate a chemical bonding with the surface of the nano-crystal 105, for example, with a coordinate bond. The ligand exist in a form a compound or an ion. In embodiments, the ligand 130 comprises at least a thiol compound. In an embodiment, the ligand 130 contains >0%-55% of the thiol compound. In other words, the ligand 130 contains the thiol compound substantially, and the thiol compound occupies 55% or less than 55% of the ligand. In another embodiment, the ligand 130 contains a fatty acid compound, a phosphine compound, and the thiol compound. For example, the fatty acid compound occupies 15%-70% of the ligand, such as 20%-65% of the ligand, or 25%-65% of the ligand. The phosphine compound occupies 1%-35% of the ligand, such as 1%-30% of the ligand, or 5%-30% of the ligand. In addition, the thiol compound occupies >0%-55% of the ligand, such as 5%-55% of the ligand, or 10%-50% of the ligand. In an embodiment, a total amount of the fatty acid compound, the phosphine compound and the thiol compound occupies 100% of the ligand, and in other words, the ligand contains no other ligand substance. In another embodiment, in addition to the fatty acid compound, the phosphine compound and the thiol compound, the ligand may use other ligand substances of different kinds. In other words, in embodiments, the ligand 130 may further contain 0%-10% of another ligand substance. The fatty acid compound may be a carboxylic acid compound, for example, having both of a $C_8$-$C_{20}$ hydrocarbyl group and a carboxyl group, comprising oleate, stearic acid, lauric acid, or a combination thereof.

The phosphine compound may be, for example, a carbon to phosphorus chemical bond containing compound having one to three $C_1$-$C_{10}$ hydrocarbyl substituent groups, comprising trioctylphosphine (TOP), tributylphosphine, triphenylphosphine, tri-t-butylphosphine, or a combination thereof.

The thiol compound may be, for example, a compound having a $C_6$-$C_{20}$ hydrocarbyl group and a thiol group, comprising octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenylldithiol, 11-mercapto-1-undecanol, or a combination thereof.

The another ligand substance comprises an alkyl amine, such as octylamine, dioctylamine, 1-hexadecylamine, oleylamine, or a combination thereof; and/or a halogen ion, such as a fluorine ion, a chlorine ion, a bromine ion, an iodine ion, or a combination thereof.

Referring to FIG. 1, in the embodiment, the nano-crystal 105 comprises a core 110 and a shell 120. In the present disclosure, the shell 120 may be also referred to as a first shell. The shell 120 encloses the core 110. The ligand 130 is disposed on a surface of the shell 120.

The core 110 may be at a center of the quantum dot 100, and may have a substantial spherical shape. The core 110 may comprise at least a cation and at least an anion. The cation may comprise a XII group element and/or a XIII group element in the periodic table. For example, the cation of the core 110 may comprise cadmium (Cd), zinc (Zn), mercury (Hg), aluminum (Al), gallium (Ga) and/or indium (In). The anion of the core 110 may comprise a XV group element and/or a XVI group element. For example, the anion may comprise sulfur (S), selenium (Se), tellurium (Te), nitrogen (N), phosphorus (P) and/or arsenic (As). In some embodiments, the core may be a binary core (for example, comprising CdSe, CdTe, CdS, ZnS, ZnSe, ZnTe, HgS, HgSe, HgTe, GaN, GaP, GaAs, AlN, AlP, AlAs, InN, InP, InAs and so on), a ternary core (for example, comprising CdZnS, ZnSeTe, CdSeS, CdZnSe, CdZnTe, CdSeTe, CdSTe, ZnSeS, ZnSTe, HgSeS, HgSeTe, HgSTe, CdHgS, CdHgSe, CdHgTe, HgZnS, HgZnSe, HgZnTe, GaNP, GaNAs, GaPAs, AlNP, AlNAs, AlPAs, InNP, InNAs, InPAs, and so on), or a quaternary core (for example, comprising CdZnSeS, CdZnSeTe, CdZnSTe, CdHgSeS, CdHgSeTe, CdHgSTe, HgZnSeS, HgZnSeTe, HgZnSTe, GaAlNP, GaAlNAs, GaAlPAs, GaInNP, GaInNAs, GaInPAs, InAlNP, InAlNAs, InAlPAs, and so on).

The shell 120 may substantially enclose the surface of the core 110. In addition, the shell 120 may comprise at least a cation and at least an anion. The cation of the shell 120 may comprise the XII group element, such as zinc and/or cadmium. The anion of the shell 120 may comprise the XVI group element, such as sulfur. In some embodiments, the first shell may be a binary shell (for example, comprising ZnS), or a ternary shell (for example, comprising ZnCdS).

In some embodiments, the shell 120 may have a composition having a gradient distribution. Different portions of shell 120 may have different cation contents and/or anion contents. In other words, the cation content and/or the anion content may vary from an innermost portion of the shell 120 to an outermost portion of the shell 120. For example, when the shell 120 contains zinc (Zn), cadmium (Cd), and sulfur (S), a zinc concentration of the shell 120 may be the lowest at the innermost portion of the shell 120 substantially, and may be the highest at the outermost portion of the shell 120 substantially. In other words, the zinc concentration may increase substantially in proportion to an increase of a distance from the core 110. In other words, the shell 120 has a zinc concentration increasing substantially in proportion to a distance from the core 110.

In some embodiments, the shell 120 may have a uniform (or identical) composition substantially. For example, every portion of the shell 120 may have a substantial uniform (or identical) cation content, and/or a substantial uniform (or identical) anion content.

Figure 2:
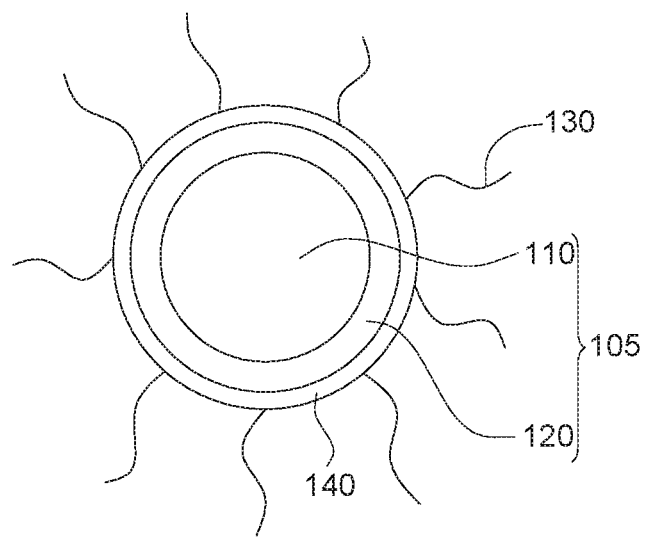
FIG. 2 is a cross-sectional diagrammatic drawing of a quantum dot according to another embodiment of the present disclosure.

FIG. 2 is a cross-sectional diagrammatic drawing of a quantum dot 200 according to another embodiment of the present disclosure. Differences of the quantum dot 200 and the quantum dot 100 in FIG. 1 are described as below.

Referring to FIG. 2, the quantum dot 200 may further comprise a shell 140. The shell 140 encloses a surface of the shell 120 substantially. As such, the quantum dot 200 has an increased particle size resulted from the shell 140. The shell 140 may provide a special (or additional) protection to the core 110. Therefore, compared to the quantum dot 100 shown in FIG. 1, which has no shell 140, the quantum dot 200 having the shell 140 shown in FIG. 2 can ensure a higher quantum yield sustaining over a long period of time.

In the present disclosure, the shell 140 may be also referred to as a second shell. The shell 140 may comprise at least a cation and at least an anion. The cation of the shell 140 may comprise the XII group element, such as zinc. The anion of the shell 140 may comprise the XVI group element, such as sulfur. In some embodiments, the shell 140 may be a binary shell (for example, comprising ZnS). The shell 140 may have a uniform (or identical) composition substantially. For example, every portion of the shell 140 may have a substantial uniform (or identical) cation content, and/or a substantial uniform (or identical) anion content. The shell 140 may have a thickness of about 1.6 nm. In some embodiments, the shell 140 may be different from the shell 120 substantially.

The ligand 130 may comprise an organic functional group. The ligand 130 may be provided onto the surface of the shell 120 or a surface of the shell 140 so as to generate a chemical bond between the ligand 130 and the surface of the shell 120, or a chemical bond between the ligand 130 and the surface of the shell 140. The organic functional group of the ligand 130 may comprise, for example, oleate, stearic acid, lauric acid, trioctylphosphine, tributylphosphine, triphenylphosphine, tri-t-butylphosphine, octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenylldithiol, 11-mercapto-1-undecanol, oleylamine, dioctylamine, a fluorine ion, a chlorine ion, a bromine ion, an iodine ion, or a combination thereof.

In some embodiments, the ligand 130 comprising both of the fatty acid compound and the thiol compound, or the ligand 130 comprising both of the phosphine compound and the thiol compound may be provided onto the surface of the shell 120. As such, a strong chemical boning of the ligand 130 to the shell 120 may be generated, and the ligand 130 would not detach from the surface of the shell 120 during a washing process that would be performed repeatedly for manufacturing the quantum dot 100. Therefore, the quantum dot 100 can sustain a higher quantum yield over a long period of time.

In other embodiments, the ligand 130 comprises the fatty acid compound, the phosphine compound and the thiol compound may be formed on the surface of the shell 140 all. As such, the quantum dot 100 can have a high quantum yield relatively due to a strong chemical boning between the shell 140 and the ligand 130. The quantum dot 100 exhibits various colors according to a composition and/or size of which. Therefore, the quantum dot 100 can emit an emission light of various colors, such as blue, red, green, and so on. In some embodiments, the quantum dot 100 may be a blue quantum dot or a green quantum dot.

Specifically, the quantum dot 100 may emit an emission light having a wavelength of 400 nm to 700 nm after receiving an incident light having a wavelength equal to or greater than 350 nm and less than the wavelength of the emission light, such as an incident light having a wavelength of 390 nm to 500 nm. In addition, a spectrum peak of the emission light emitted from the quantum dot 100 has a full width at half maximum (FWHM) of 20 nm to 60 nm, for example. In some embodiments, an emission light emitted from the green quantum dot has a wavelength of 500 nm to 600 nm, or 510 nm to 560 nm, or 520 nm to 550 nm, for example. In other embodiments, an emission light emitted from a red quantum dot has a wavelength of 600 nm to 700 nm, or 605 nm to 680 nm, or 610 nm to 660 nm, for example. An emission light emitted from the blue quantum dot has a wavelength of 400 nm to 500 nm, or 430 nm to 470 nm, or 440 nm to 460 nm, for example. For example, a wavelength, an intensity, and a full width at half maximum (FWHM) of an emission light emitted from the quantum dot can be obtained through photoluminescence analysis with using a photoluminescence analyzer (made by Horiba, model: FluoroMax-3).

In some embodiments, the red quantum dot has an average particle size of 3 nm to 25 nm, or 4 nm to 15 nm, or 5 nm to 10 nm, for example. The green quantum dot has an average particle size of 2 nm to 20 nm, or 3 nm to 15 nm, or 4 nm to 9 nm, for example. The blue quantum dot has an average particle size of 1 nm to 15 nm, or 2 nm to 10 nm, or 2 nm to 8 nm, for example.

According to embodiments, a method for manufacturing the quantum dot comprises mixing the nano-crystal and the ligand in a liquid phase environment. For example, in an embodiment, the ligand and the core of the nano-crystal may be mixed in the liquid phase environment. In another embodiment, the ligand and the nano-crystal comprising the core and the shell may be mixed in the liquid phase environment. In yet another embodiment, the ligand and the core of the nano-crystal may be mixed in the liquid phase environment, and meanwhile, the liquid phase environment has a raw material providing an element for forming the shell of the nano-crystal. As such, the nano-crystal comprising the core and the shell may be formed, and the ligand may be formed on the surface(s) of the core and/or the shell of the nano-crystal simultaneously during the mixing step. In yet more another embodiment, the ligand and the raw material providing an element for forming the core and the shell of the nano-crystal may be mixed in the liquid phase environment. As such, the nano-crystal comprising the core and the shell may be formed, and the ligand may be formed on the surface(s) of the core and/or the shell of the nano-crystal simultaneously during the mixing step.

Figure 3:
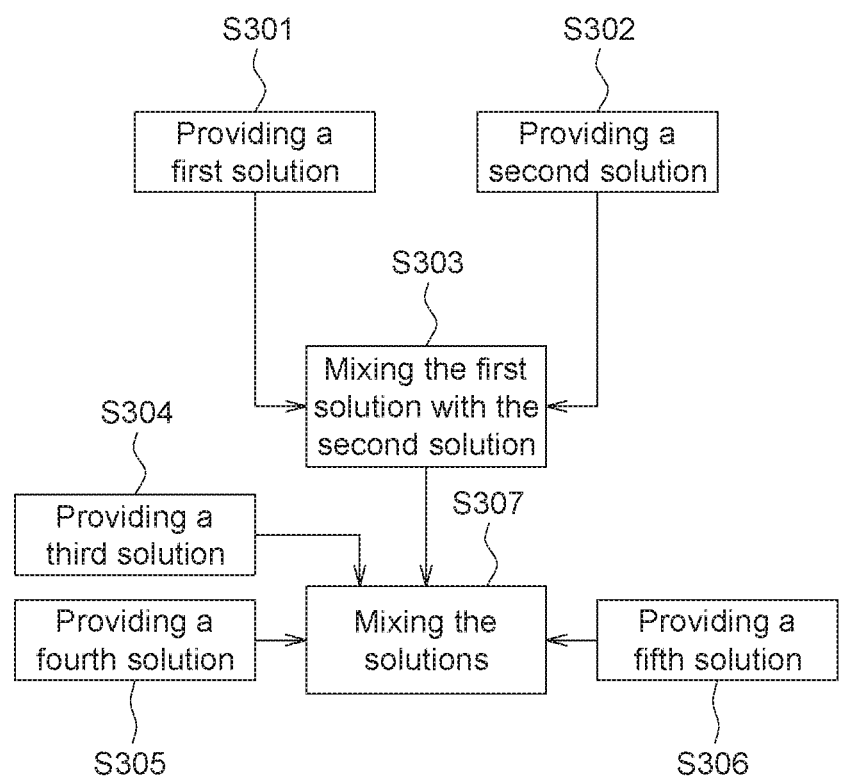
FIG. 3 is a flow diagram of a method for manufacturing a quantum dot according to an embodiment of the present disclosure.

FIG. 3 is a flow diagram of a method for manufacturing the quantum dot according to an embodiment of the present disclosure.

A step S301 is performed, providing a first solution. The first solution contains at least one element selected from the group consisting of a XII group element and a XIII group element. Specifically, the XII group element or the XIII group element exists in a form of a cation in the first solution. For example, the XII group element of the first solution may comprise zinc, cadmium, mercury or a combination thereof. The XIII group element of the first solution may comprise aluminum, gallium, indium or a combination thereof. In some embodiments, the first solution may be formed by mixing the XII group element (or a precursor of which) or the XIII group element (or a precursor of which) with the fatty acid compound. The fatty acid compound may comprise oleic acid (OA), stearic acid, lauric acid, or a combination thereof. In some embodiments, the first solution has a first temperature. The first temperature may be within a range of 230° C. to 330° C. In other embodiments, the first temperature may be within a range of 240° C. to 320° C., such as 250° to 320° C.

A step S302 is performed, providing a second solution. The second solution contains at least one element selected from the group consisting of a XV group element and a XVI group element. Specifically, the XV group element or the XVI group element exists in a form of an anion in the second solution. For example, the XV group element of the second solution may comprise at least one of nitrogen, phosphorus and arsenic. The XVI group element of the second solution may comprise at least one of oxygen, sulfur, selenium and tellurium. In some embodiments, the second solution may be formed by mixing the XV group element (or a precursor of which) or the XVI group element (or a precursor of which) with the phosphine compound, the alkyl amine and/or the halogen ion. The phosphine compound may comprise trioctylphosphine (TOP), tributylphosphine, triphenylphosphine, tri-t-butylphosphine, or a combination thereof. The alkyl amine may comprise octylamine, dioctylamine, 1-hexadecylamine, oleylamine, or a combination thereof. The halogen ion may comprise a fluorine ion, a chlorine ion, a bromine ion, an iodine ion, or a combination thereof. In some embodiments, the step S302 may be performed at the room temperature. The room temperature is within a range of 20° C. to 30° C.

A step S303 is performed, mixing the first solution with the second solution. By the step S303, a mixed solution containing the core for the quantum dot may be formed. It should be noted that the core for the quantum dot described herein is the core 110 of the quantum dot 100 shown in FIG. 1, or the core 110 of the quantum dot 200 shown in FIG. 2. In detail, during the step S303, a reaction between the cation of the first solution and the anion of the second solution occurs so as to form the core 110 and the shell 120. In particular, a reaction between the cation of at least one kind and the anion of at least one kind occurs so as to form the core 110 of a binary core, a ternary core, a quaternary core, or a core of more kinds of elements.

In the step S303, the reaction of forming the core 110 is an endothermic reaction. In other words, a temperature of the mixed solution formed by mixing the first solution and the second solution is lower than the temperature of the first solution or the temperature of the second solution before mixing. In some embodiments, the temperature of the first solution is 230° C. to 330° C., and the temperature of the second solution is the room temperature. As a result of the endothermic reaction and a temperature difference between the first solution and the second solution, the temperature of the mixed solution formed by mixing the first solution and the second solution is lower than the temperature of the first solution. For example, a range of temperature difference of the mixed solution with respect to the first solution may be 5° C. to 30° C.

In some embodiments, a thermal treatment may be performed to the mixed solution. As a result, the temperature of the mixed solution can be increased, so as to return to the higher one of the temperature of the first solution and the temperature of the second solution. In some embodiments, the temperature of the mixed solution after the thermal treatment may be higher than the temperature of the first solution and the temperature of the second solution. A range of a heating rate of the thermal treatment is 2° C./minute to 10° C./minute. In some embodiments, the range of the heating rate of the thermal treatment may be 3° C./minute to 8° C./minute. In other embodiments, the range of the heating rate of the thermal treatment is 3.5° C./minute to 7.5° C./minute. Moreover, an operation time of the thermal treatment can be within a range of 1 minute to 15 minutes, or within a range of 1.5 minutes to 10 minutes. The step of the thermal treatment may be before an end point of the step S303. In other words, the thermal treatment may be performed to the mixed solution while mixing the first solution and the second solution. In other embodiments, a starting point of the step of the thermal treatment may also be later than the end point of the step S303. In other words, the thermal treatment may be performed to the mixed solution after the mixing of the first solution and the second solution is complete.

A step S304 is performed, providing a third solution. The third solution may comprise the XVI group element, and the phosphine compound, the alkyl amine and/or the halogen ion. The phosphine compound may comprise trioctylphosphine, tributylphosphine, triphenylphosphine, tri-t-butylphosphine, or a combination thereof. The alkyl amine may comprise octylamine, dioctylamine, 1-hexadecylamine, oleylamine, or a combination thereof. The halogen ion may comprise a fluorine ion, a chlorine ion, a bromine ion, an iodine ion, or a combination thereof.

A step S305 is performed, providing a fourth solution. The fourth solution may comprise the XII group element and the fatty acid compound. The fatty acid compound may comprise oleate, stearic acid, lauric acid, or a combination thereof.

A step S306 is performed, providing a fifth solution. The fifth solution may comprise the XVI group element and the thiol compound. The thiol compound may comprise octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenyldithiol, 11-mercapto-1-undecanol, or a combination thereof.

A step S307 is performed, mixing the solutions. In detail, the third solution, the fourth solution and the fifth solution are added into the mixed solution formed by mixing the first solution and the second solution in the step S303. In some embodiments, the XII group element of the third solution exists in a form of a cation in the third solution, and the XVI group element of the fourth solution exists in a form of an anion in the fourth solution, and a reaction of which forms the shell 140 of the quantum dot 100. As a result, the quantum dot 100 comprises the shell 140, the shell 120 and the core 110 from outside to inside. The first shell 120 and the core 110 may respectively be single-layer structures, and can respectively be multilayer structures as well.

In some embodiments, the third solution, the fourth solution, and the fifth solution may be added in sequence into the mixed solution formed by the step S303.

In some embodiments, the step S307 may be performed at a second temperature. In some embodiments, a range of the second temperature may be 230° C. to 330° C. In other embodiments, the range of the second temperature may be 240° C. to 320° C., such as 250° C. to 320° C. In some embodiments, the second temperature may be higher than the first temperature. During the forming process of the shell 120, by performing a heating process, the semiconductor material forming the shell 120 can be successfully formed on the surface of the core 110, rather than being dispersed in the solution. As a result, the shell 120 of the quantum dot can preferably protect the core 110 to prevent the core 110 from damage of external moisture, oxygen, and blue light. Therefore, a reliability of the quantum dot can be improved.

Next, the solution obtained in the step S307 is precipitated, centrifugally separated, and washed with a polar solvent such as acetone, ethanol, and so on, so as to obtain the quantum dot 100 of the present embodiment.

In some embodiments, the ligand 130 can be referred to as a sealing agent, and can inhibit gathering of a plurality of the quantum dots, and can suitably isolate the quantum dot from an external environment. In other embodiments, a surface of the quantum dot 100 may also be modified by adding an additional sealing agent to form the ligand 130 on the surface of the first shell 120.

According to concepts of embodiments, a sequence of the step S301, the step S302, the step S304, the step S305, and the step S306 is not limited, as long as the first solution and the second solution can be mixed through the step S303, and then the mixed solution obtained by the step 307 can be mixed with third solution, the fourth solution and the fifth solution so as to obtain the quantum dot according to the concepts of the present disclosure.

In embodiments, the quantum dot can be applied for a luminescent material.

In some embodiments, a method for manufacturing the luminescent material with using the above disclosed quantum dot may comprise the following steps.

First, a quantum dot solution and a carrier solution are provided. The quantum dot solution contains a plurality of the aforementioned quantum dots and a solvent for dispersing the quantum dots. Similarly, the carrier solution contains a plurality of carriers and a solvent for dispersing the carriers. For example, the solvent of the quantum dot solution and the solvent of the carrier solution can respectively include n-hexane. In some embodiments, a weight percentage of the quantum dots in the quantum dot solution is 0.1% to 5%. A weight percentage of the carriers in the carrier solution is 0.5% to 10%.

In some embodiments, a material of the carrier can be at least one selected from the group consisting of an organic polymer, an inorganic polymer, a water-soluble polymer, an organic solvent-soluble polymer, a biopolymer, and a synthetic polymer. For example, the material of the carrier may be at least one selected from the group consisting of polysiloxane, polyacrylate, polycarbonate, polystyrene, polyethylene, polypropylene, polyketide, polyetheretherlketone, polyester, polyamide, polyimide, polyacrylamide, polyolefin, polyacetylene, polyisoprene, ploybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the material of the carrier can also be an inorganic medium such as at least one selected from the group consisting of silica gel, bentonite, glass, water glass, quartz, kaoline, silicon dioxide, aluminum oxide, and zinc oxide.

The polysiloxane is obtained from a hydrolysis condensation reaction by adding water to the siloxane compound shown in the formula (I) as below:

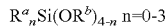  formula (I);

$R^a$ represents a $C_2$ to $C_{15}$ aromatic group and $R^b$ represents a $C_1$ to $C_5$ alkyl group. The aromatic group is (but not limited to) a phenyl group, a tolyl group, a p-hydroxyphenyl group, a 1-(p-hydroxyphenyl)ethyl group, a 2-(p-hydroxyphenyl) ethyl group, a 4-hydroxy-5-(p-hydroxyphenylcarbonyloxy) pentyl group, or a naphthyl group, for example. The alkyl group is (but not limited to), a methyl group, an ethyl group, an n-propyl group, an isopropyl group, or an n-butyl group, for example. In some embodiments, the polysiloxane can be obtained from the hydrolysis condensation reaction of tetraethoxysilane (TEOS).

An average particle size of the carrier is 0.1 μm to 25 μm, or 0.3 μm to 15 μm, or 0.5 μm to 10 μm. In some embodiments, the material of the carrier is porous. An average surface pore size of the porous carrier is 3 nm to 100 nm. In some embodiments, the quantum dot is the green quantum dot, and the average surface pore size of the porous carrier is 5 nm to 30 nm, or 5 nm to 25 nm, or 5 nm to 20 nm, for example. In other embodiments, the quantum dot is the red quantum dot, and the average surface pore size of the porous carrier is 7 nm to 40 nm, or 7 nm to 35 nm, or 7 nm to 30 nm, for example. Moreover, when the quantum dot is the blue quantum dot, the average surface pore size of the porous carrier is 3 nm to 25 nm, or 3 nm to 20 nm, or 3 nm to 15 nm, for example. A specific surface area of the porous carrier is 100 m²/g to 1000 m²/g, for example. In some embodiments, the porous carrier is a porous microparticle. The porous microparticle may be a silicon dioxide particle.

The carrier may be a lipophilic carrier. For example, the porous micropartide can be a lipophilic silicon dioxide particle. The lipophilic silicon dioxide particle is obtained by modifying a silicon dioxide particle with a silane compound shown in formula (II) below:

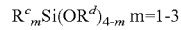  formula (II);

$R^c$ represents a $C_3$ to $C_{20}$ alkyl group, and $R^d$ represents a $C_1$ to $C_5$ alkyl group. In some embodiments, $R^c$ is an octyl group, a nonyl group, or a decyl group. $R^d$ is (but not limited to) a methyl group, an ethyl group, an n-propyl group, an isopropyl group, or an n-butyl group, for example.

For example, the porous carrier consisted of silicon dioxide may have an average particle diameter of 1 μm to 5 μm, an average surface pore size of 5 nm to 15 nm, and a specific surface area of 500 m²/g to 900 m²/g; or an average particle size of 1 μm to 5 μm, an average surface pore size of 10 nm to 30 nm, and a specific surface area of 250 m²/g to 750 m²/g; or an average particle size of 0.5 μm to 1.5 μm, an average surface pore size of 5 nm to 15 nm, and a specific surface area of 200 m²/g to 600 m²/g; or an average particle size of 0.1 μm to 0.5 μm, an average surface pore size of 3 nm to 12 nm, and a specific surface area of 100 m²/g to 500 m²/g.

Next, the quantum dot solution and the carrier solution are mixed. In this step, the quantum dot in the quantum dot solution can be attached onto the carrier in the carrier solution. In some embodiments, the carrier is the porous carrier, which benefits uniform and stable attaching of the quantum dots on the carrier. Next, the solution containing the quantum dot and the carrier may be left to stand, and then a centrifugation and a filtration are performed to obtain the carrier to which the quantum dot is attached.

Next, the solution containing the quantum dot and the carrier is mixed with and a solution containing an encapsulating material. In this step, the encapsulating material can enclose a surface of the carrier to which the quantum dot is attached to form an encapsulating layer. In some embodiments, a thickness of the encapsulating layer may be 0.1 nm to 20 nm.

The encapsulating material may be at least one selected from the group consisting of an organic polymer, an inorganic polymer, a water-soluble polymer, an organic solvent-soluble polymer, a biopolymer, and a synthetic polymer. For example, the encapsulating material may be at least one selected from the group consisting of polysiloxane, polyacrylate, polycarbonate, polystyrene, polyethylene, polypropylene, polyketide, polyetheretherketone, polyester, polyamide, polyimide, polyacrylamide, polyolefin, polyacetylene, polyisoprene, ploybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the encapsulating material may also be an inorganic medium such as at least one selected from the group consisting of silica gel, bentonite, glass, water glass, quartz, kaoline, silicon dioxide, aluminum oxide, and zinc oxide. In some embodiments, the encapsulating layer and the carrier may be formed by the same material. In other embodiments, the encapsulating layer and the carrier may also be formed by different materials.

Next, a centrifugal separation may be performed to the solution containing the carrier, the quantum dot, and the encapsulating layer to obtain a luminescent material. In other words, the luminescent material may comprise the carrier, the quantum dot, and the encapsulating layer. The quantum dot is attached on the surface of the carrier, and the encapsulating layer encloses the quantum dot and the carrier.

In some embodiments, a weight percentage of the quantum dot occupying in the luminescent material may be 0.1% to 20%. In other embodiments, the weight percentage of the quantum dot occupying in the luminescent material may also be 0.2% to 15%, or 0.3% to 10%. When the weight percentage of the quantum dot occupying in the luminescent material is less than 0.1%, a concentration of the quantum dot in the luminescent material is low, and therefore an overall luminous efficiency of the luminescent material is poor. When the weight percentage of the quantum dot occupying in the luminescent material is higher than 20%, a self-absorption readily occurs to the quantum dot, and therefore the overall luminous efficiency of the luminescent material is reduced, and a red shift occurs to the emission light. For example, the weight percentage can be measured by an inductively-coupled plasma (ICP) spectral analysis method.

In some embodiments, the luminescent material can be applied in the encapsulating material for a light-emitting device. For example, the encapsulating material of the light-emitting device may include an epoxy resin, polysiloxane resin, acrylate resin, or glass, and so on. In the light-emitting device, the encapsulating material encloses a light source (such as a LED, a laser source, an arc lamp, and a blackbody light source) such that a primary light generated by the light source may excite the quantum dot in the encapsulating material to generate a secondary light. A wave band of the primary light may be different from a wave band of the secondary light. In other words, a color of the primary light may be different from a color of the secondary light. Moreover, predetermined intensity and wavelength of the entire light emitted by the light-emitting device may be satisfied by a suitable mixture of the primary light and the secondary light according to the colors thereof. It should be noted that the light emitted by the light-emitting device may be only the light emitted by the quantum dot (i.e., the secondary light), or a mixture of the light emitted by the light source and the light emitted by the quantum dot (i.e., a mixture of the primary light and the secondary light). In some embodiments, the luminescent material may include a single type of the quantum dot, or a plurality of types of the quantum dot having different colors.

Figure 4:
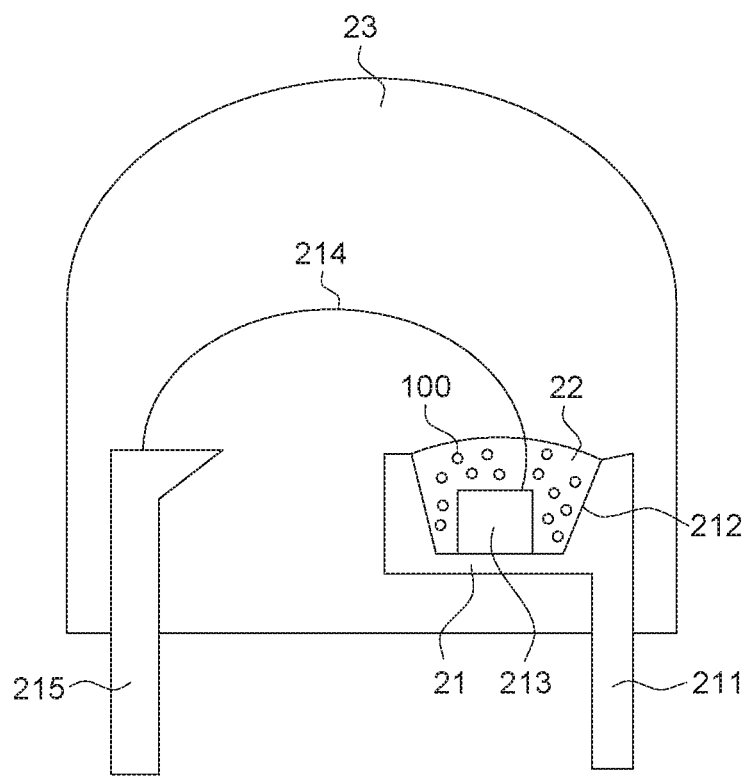
FIG. 4 illustrates a cross-sectional diagram of a light emitting device in an embodiment.

In the present embodiment, the luminescent material can be applied in the encapsulating material for a light emitting diode (LED). The encapsulating material for use may be (but not limited to) an epoxy resin, a polysiloxane resin, an acrylate resin, a glass, for example. The light emitting diode (LED) may be used as a backlight unit or a light-emitting element for other light emitting devices. Otherwise, the light emitting diode (LED) may be applied in a quantum dot light emitting diode (QLED) display display device having a plurality of the light emitting diodes arranged in an array, and each LED in the QLED display equipment is a single pixel FIG. 4 illustrates a cross-sectional diagram of the light emitting device in an embodiment. The light emitting device comprises a light emitting unit 21, a phosphor layer 22, and an encapsulating layer 23. The light emitting unit 21 comprises a base 211 having a conductive characteristic and having a concave bearing surface 212, a light-emitting element 213 disposed in the concave bearing surface 212 and electrically connected to the base 211, a connection wire 214 electrically connected to the light-emitting element 213, and a conductive wire 215 electrically connected to the connection wire 214. The base 211 and the conductive wire 215 can cooperate to supply an external electrical energy to the light-emitting element 213. The light-emitting element 213 can convert the electrical energy to light energy and emit it out. In an embodiment, the light-emitting element 213 uses a commercial available InGaN light-emitting element (EPISTAR Corporation) of light emitting wavelength of 455 nm, and is adhered on the concave bearing surface 212 of the base 211 with a conductive silver paste (BQ6886, Uninwell International). The light-emitting element 213 is electrically connected to the conductive wire 215 through the connection wire 214 extended from the top surface of the light-emitting element 213. The phosphor layer 22 encloses the light-emitting element 213. After the luminescent material 100 contained in the phosphor layer 22 is excited by a light emitted from the light-emitting element 213, the luminescent material 100 converts the light emitted from the light-emitting element 213 to emit a light having a wavelength different from the wavelength of the exciting light. In the present embodiment, the phosphor layer 22 is formed by coating a polysiloxane resin with the luminescent material 100 contained therein on an external surface of the light-emitting element 213 followed by a drying and a curing.

In the present disclosure, the luminescent material may use the quantum dots and the phosphors of various colors and materials. When more kinds of the quantum dots and the phosphors with different compositions (i.e. more different emission wavelengths) are used, the light emitting device can achieve a wider emission spectrum, even achieve a full spectrum for demands. Therefore, using the luminescent material according to the present disclosure for the display device can improve a color gamut, a color purity, a color trueness, NTSC, etc., effectively. In embodiments, the NTSC of the display device may be adjusted by the phosphors disposed on a LED chip in a LED element to achieve NTSC 100% and reduce the manufacturing cost.

Figure 5:
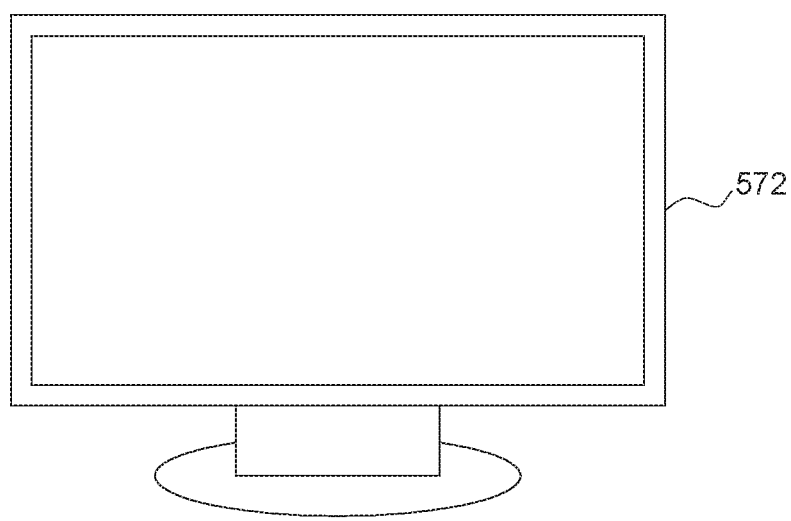
FIG. 5 is a diagrammatic drawing of a display device according to a concept of an embodiment.

In the present disclosure, the light-emitting element may be applied in various display devices, for example, a television 572 (which may be referred to as a television receiver) (as shown in FIG. 5), a digital photo camera, a digital video camera, a digital photo frame, a mobile phone, a notebook, a mobile computer, a computer screen, a portable game console, a portable information terminal, a portable audio player, a game console, a car display and a wearable device (such as a smart watch or virtual reality glasses), and so on.

It should be understood that the luminescent material of the present disclosure is not limited to the encapsulating material for the LED, and may be applied for an optical film, an optical plate, a transparent tube member, an optical part, a back light unit, a light emitting device, a color converting material, an optical material, an oil ink, a labeling agent, etc.

An experimental example and a comparative example are provided below to verify the effect of the invention, but the invention is not limited to the following content.

EMBODIMENT

First, a first solution was provided. 18 mg of cadmium oxide, 813 mg of zinc acetate, and 7 mL of oleic acid were added into a three-necked flask. Next, 15 mL of octadecene was added into the three-necked flask. The solution in the three-necked flask reacted, and was mixed by heating in vacuum at 120° C. Next, the three-necked flask was filled with nitrogen gas, and a temperature was increased to 290° C.

A second solution was provided. The first solution and the second solution were mixed, and a thermal treatment was performed to the mixed solution of the first solution and the second solution. 2.1 mL and 0.001 mol of trioctyl selenide (TOP-Se) and 58 mg of sulfur were added into the three-necked flask, and the temperature of the solution in the three-necked flask was returned to 290° C. with a heating rate of 5.96° C./minute, and the reaction of the solution was performed under the constant temperature of 290° C.

A third solution, a fourth solution and a fifth solution were added into the mixed solution. The third solution comprised 100 mg of sulfur and 1.9 mL of trioctylphosphine. The fourth solution comprised 525 mg of zinc acetate, 1.83 mL of oleate and 4 mL of octadecene. The fifth solution comprised 1.5 mL of 1-dodecanethiol (DDT), 160 mg of sulfur, and 5 mL of trioctylphosphine. Next, the solution was stirred to generate a yellow-green suspension liquid, and then the suspension liquid was cooled and precipitated using 300 mL of ethanol. The centrifugally separated product after precipitation was a green quantum dot. A peak value of an emission light emitted from the green quantum dot was 525 nm, and a FWHM thereof was 22 nm.

The quantum dots were mixed with n-hexane to form a quantum dot solution. A weight percentage of the quantum dots occupying in the quantum dot solution was 1%. Moreover, a porous silicon dioxide particle carrier was mixed with n-hexane to prepare a carrier solution. The porous silicon dioxide particle had an average diameter of 3 μm, an average surface pore size of 10 nm, and a specific surface area of 700 $m^2$/g. Moreover, the porous silicon dioxide particle was modified to be lipophilic. In the carrier solution, a weight percentage of the porous silicon dioxide particles was 5%.

0.25 g of the quantum dot solution and 5 g of the carrier solution were mixed and left to stand for 10 minutes. Next, centrifugal filtration was performed to the solution including the quantum dots and the carriers to obtain a porous silicon dioxide particle to which the quantum dot was attached, i.e., the carrier to which the quantum dot was attached. Next, the carrier to which the quantum dot was attached was added in 250 g of ethanol and evenly dispersed.

A solution including an encapsulating material was provided. The solution included 0.5 g of tetraethoxysilane (TEOS) and 2.5 g of ammonia water ($NH_4OH$) having a weight percentage of 29%. The solution including the encapsulating material was added in an ethanol solution including the carrier to which the quantum dot was attached, and the mixture was stirred under the room temperature for 4 hours to form an encapsulating layer on the surface of the carrier to which a quantum dot was attached. A pH value of the solution including the carrier, the quantum dot, and the encapsulating layer was within a range of 10 to 11. Next, centrifugal separation was performed to the solution including the carrier, the quantum dot, and the encapsulating layer, and then the solution was cleaned with pure water 3 times then dried to obtain 0.2778 g of a micron-meter level luminescent material.

Comparative Example 1

A manufacturing method of a quantum dot of the comparative example 1 was similar to the manufacturing method of the quantum dot of the embodiment. The difference between the two was only in that the fifth solution of the comparative example 1 used 321 mg of sulfur and 5 mL of trioctylphosphine.

Comparative Example 2

A manufacturing method of a quantum dot of the comparative example 2 was similar to the manufacturing method of the quantum dot of the embodiment. The difference between the two was only in that the fifth solution of the comparative example 2 used 6.0 mL of 1-dodecanethiol (DDT), 32 mg of sulfur and 5 mL of trioctylphosphine.

Composition of Ligand of Quantum Dot

A pyrolysis-gas chromatography-mass spectrometry (Pyrolysis-GC/MS) was used to analyze compositions of the ligands of the quantum dots of embodiment, comparative example 1, and comparative example 2 (i.e. proportions of oleate (OA), 1-dodecanethiol (DDT), and trioctylphosphine (TOP)). The model of the pyrolyzer was Pyrolyzer EGA/PY-3030D, and the operation parameters of which was the furnace temperature of 450° C., the pyrolysis time of 1 minute, the interface temperature of 320° C. The model of the gas chromatograph was Agilent 7890A, and the operation temperature was set as being at a constant temperature of 50° C. for 2 minutes, and then increased with a heating rate of 10° C./min to another constant temperature of 300° C. for 13 minutes. The model of the mass spectrometer was Agilent 5975C. The capillary column was Agilent UA5-30M-0.25FUA5-30M-0.25F. The flow split ratio of the injection port was set as being 50:1. The flow rate was 1 ml/min. The mass spectrometric scan range was 15-700. The kinds of the ligands resulting in the spectrum peaks in the gas chromatography spectrum can be got through the data obtained from the mass spectrometry, and the results are shown in the following table 1.

TABLE 1

| position of peak value (min) | 10.8 | 13.86 | 14.68 | 15.55 | 16.32 | 18.41 | 20.55 | 26.51 | 27.76 | 28.31 | 30.19 | 33.04 |
|---|---|---|---|---|---|---|---|---|---|---|---|---|
| Corresponding ligand | DDT | DDT | DDT | DDT | DDT | OA | OA | DDT | TOP | DDT | OA | OA |

The results of the composition of the ligand listed in the table 2 as below are obtained by calculating the area of each of 12 spectrum peaks in the table 1 by integrating method, and then calculating the ratio of the area of each of the 12 spectrum peaks to the total area of the 12 spectrum peaks, and then summing the values corresponding to oleate (OA), 1-dodecanethiol (DDT), and trioctylphosphine (TOP), respectively. The symbol "-" shown in the table 2 represents the concentration of DDT of the quantum of the comparative example 1 is lower than the detection limit, and in other words, the ligand of which contains no DDT.

TABLE 2

| | Composition of ligand | | | |
|---|---|---|---|---|
| | OA | TOP | DDT | quantum yield |
| embodiment | 53% | 5% | 42% | 79% |
| comparative example 1 | 76% | 24% | — | 60% |
| comparative example 2 | 41% | 2% | 57% | 61% |

Quantum Yield

The quantum yields of the luminescent materials of micron-meter level manufactured in the embodiment, the comparative example 1, and the comparative example 2 were respectively measured by the following method. The sample solution having the transmittance (%) within the range of 71%-79% under a blue light (wavelength 450 nm) was prepared by dispersing the luminescent material in hexane used as a solvent. The excitation light integral area and the emission light integral area of each of the sample solution and the solvent (hexane, blank experiment) were respectively measured by using the photoluminescence analyzer (made by HORIBA corporation, model: FluoroMax-3) with the integration ball (HORIBA QUANTA-φ F-3029). Then, the quantum yield of the sample solution was calculated through the following equation:

$$\Phi = \frac{E_c - E_a}{L_a - L_c}$$

(Φ: the quantum yield; Ec: the emission light integral area of the sample solution; Ea: the emission light integral area of hexane; Lc: the excitation light integral area of the sample solution; La: the excitation light integral area of hexane. The results are shown in the table 2.

As shown in the table 2, the quantum yield of the embodiment calculated as aforementioned measurement is 79%. The quantum yield of the comparative example 1 calculated as aforementioned measurement is 60%. The quantum yield of the comparative example 2 calculated as aforementioned measurement is 61%. It verifies that the quantum dot having a ligand containing 15%-70% of a fatty acid compound, 1%-35% of a phosphine compound, >0%-55% of a thiol compound, and 0%-10% of another ligand according to the embodiment concept of the present disclosure can have a higher quantum yield.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A quantum dot, comprising:
a nano-crystal being at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal; and
a ligand disposed on a surface of the nano-crystal, wherein the ligand contains 15%-70% of a fatty acid compound, 1%-35% of a phosphine compound, >0%-55% of a thiol compound, and 0%-10% of another ligand substance, obtained by calculating ratios of respective integrated areas to a total integrated area of spectrum peaks corresponding to the fatty acid compound, the phosphine compound, the thiol compound, and the another ligand substance in a gas chromatography spectrum.

2. The quantum dot according to claim 1, wherein,
the fatty acid compound comprises an oleate, a stearic acid, a lauric acid, or a combination thereof;
the phosphine compound comprises trioctylphosphine, triphenylphosphine, t-butylphosphine, or a combination thereof;
the thiol compound comprises octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenylldithiol, 11-mercapto-1-undecanol, or a combination thereof; and/or
the another ligand substance comprises octylamine, dioctylamine, 1-hexadecylamine, oleylamine, a fluorine ion, a chlorine ion, a bromine ion, an iodine ion, or a combination thereof.

3. The quantum dot according to claim 1, wherein the nano-crystal comprises a core and a shell enclosing the core.

4. The quantum dot according to claim 1, wherein the thiol compound occupies 5%-55% of the ligand.

5. The quantum dot according to claim 1, wherein the fatty acid compound occupies 20%-65% of the ligand, the phosphine compound occupies 1%-30% of the ligand, the thiol compound occupies 10%-50% of the ligand.

6. The quantum dot according to claim 1, wherein the fatty acid compound occupies 25%-65% of the ligand, the phosphine compound occupies 5%-30% of the ligand, the thiol compound occupies 10%-50% of the ligand.

7. A luminescent material comprising the quantum dot according to claim 1.

8. A light-emitting element, comprising:
a light source; and
an encapsulating material comprising the luminescent material according to claim 7, wherein the encapsulating material encloses the light source.

9. A display device, comprising the light-emitting element according to claim 8, wherein the display device is at least one selected from the group consisting of a television, a digital photo camera, a digital video camera, a digital photo frame, a mobile phone, a notebook, a mobile computer, a computer screen, a portable game console, a portable information terminal, a portable audio player, a game console, a car display and a wearable device.

10. A quantum dot, comprising:
a nano-crystal being at least one selected from the group consisting of a XII-XV group compound semiconductor nano-crystal, a XII-XVI group compound semiconductor nano-crystal, a XIII-XV group compound semiconductor nano-crystal and a XIII-XVI group compound semiconductor nano-crystal; and
a ligand disposed on a surface of the nano-crystal, wherein the ligand consists essentially of a thiol compound, a fatty acid compound and a phosphine compound, wherein the fatty acid compound occupies 20%-65% of the ligand, the phosphine compound occupies 1%-30% of the ligand, the thiol compound occupies 10%-50% of the ligand, obtained by calculating ratios of respective integrated areas to a total integrated area of spectrum peaks corresponding to the fatty acid compound, the phosphine compound, and the thiol compound in a gas chromatography spectrum.

11. The quantum dot according to claim 10, wherein
the fatty acid compound comprises an oleate, a stearic acid, a lauric acid, or a combination thereof;
the phosphine compound comprises trioctylphosphine, triphenylphosphine, t-butylphosphine, or a combination thereof; and/or
the thiol compound comprises octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenylldithiol, 11-mercapto-1-undecanol, or a combination thereof.

12. The quantum dot according to claim 10, wherein the nano-crystal comprises a core and a shell enclosing the core.

13. The quantum dot according to claim 10, wherein the fatty acid compound occupies 25%-65% of the ligand, the phosphine compound occupies 5%-30% of the ligand.

14. A method for manufacturing a quantum dot, comprising mixing a nano-crystal and a ligand in a liquid phase environment, wherein the nano-crystal is at least one selected from the group consisting of a XII-XV group compound semiconductor nano-crystal, a XII-XVI group compound semiconductor nano-crystal, a XIII-XV group compound semiconductor nano-crystal, and a XIII-XVI group compound semiconductor nano-crystal, the ligand contains a fatty acid compound, a phosphine compound, and a thiol compound.

15. The method for manufacturing the quantum dot according to claim 14, wherein,
the fatty acid compound comprises an oleate, a stearic acid, a lauric acid, or a combination thereof;
the phosphine compound comprises trioctylphosphine, triphenylphosphine, t-butylphosphine, or a combination thereof;
the thiol compound comprises octanethiol, 1,8-octanedithiol, 1-dodecanethiol, 1-undecanethiol, 1,4-benzene dimethanethiol, 1,16-hexadecanedithiol, 1,11-undecanedithiol, 4,4'-biphenylldithiol, 11-mercapto-1-undecanol, or a combination thereof.

16. The method for manufacturing the quantum dot according to claim 14, wherein the nano-crystal comprises a core and a shell enclosing the core.

17. The method for manufacturing the quantum dot according to claim 14, wherein the thiol compound occupies 5%-55% of the ligand, obtained by calculating a ratio of an integrated area of a spectrum peak corresponding to the thiol compound to a total integrated area of spectrum peaks corresponding to all compounds of the ligand in a gas chromatography spectrum.

18. The method for manufacturing the quantum dot according to claim 14, wherein the fatty acid compound occupies 20%-65% of the ligand, the phosphine compound occupies 1%-30% of the ligand, the thiol compound occupies 10%-50% of the ligand, obtained by calculating ratios of respective integrated areas corresponding to the fatty acid compound, the phosphine compound, and the thiol compound to a total integrated area of spectrum peaks corresponding to all compounds of the ligand in a gas chromatography spectrum.

* * * * *